United States Patent
Chen et al.

(10) Patent No.: US 7,209,068 B1
(45) Date of Patent: Apr. 24, 2007

(54) ANALOG TO DIGITAL CONVERTER ELEMENTS AND METHODS FOR USING SUCH

(75) Inventors: Mingdeng Chen, Harleysville, PA (US); James A. Bailey, Snowflake, AZ (US); Siamak Mortezapour, Fremont, CA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/347,345

(22) Filed: Feb. 3, 2006

(51) Int. Cl.
*H03M 1/12* (2006.01)
(52) U.S. Cl. .................. 341/161; 341/155
(58) Field of Classification Search ........... 341/155, 341/161
See application file for complete search history.

(56) References Cited

U.S. PATENT DOCUMENTS

| | | | | |
|---|---|---|---|---|
| 6,011,502 A | * | 1/2000 | Kao | 341/156 |
| 6,556,158 B2 | * | 4/2003 | Steensgaard-Madsen | 341/131 |
| 6,563,445 B1 | * | 5/2003 | Sabouri | 341/120 |
| 6,580,382 B2 | * | 6/2003 | Yung | 341/139 |
| 6,784,824 B1 | * | 8/2004 | Quinn | 341/172 |
| 7,116,260 B2 | * | 10/2006 | Luh | 341/155 |
| 7,129,874 B2 | * | 10/2006 | Bjornsen | 341/143 |

* cited by examiner

*Primary Examiner*—Peguy JeanPierre
(74) *Attorney, Agent, or Firm*—Hamilton, DeSanctis & Cha LLP (57) ABSTRACT

Various systems and methods for converting a signal from the analog domain to the digital domain are disclosed herein. As one example, an analog-to-digital converter is disclosed that includes two pipelined analog-to-digital converter stages. The first analog-to-digital converter stage provides an encoded word output and the second analog-to-digital converter stage provides an unencoded word output. A summation device is provided to aggregate the encoded word output with the unencoded word output.

20 Claims, 8 Drawing Sheets

ANALOG TO DIGITAL CONVERTER ELEMENTS AND METHODS FOR USING SUCH

BACKGROUND OF THE INVENTION

The present invention is related to systems and methods for performing data conversions, and more particularly to systems and methods for performing analog-to-digital conversions.

A variety of applications require signal conversion from the digital domain to the analog domain. For example, video is typically captured using an array of pixels, and analog values from those pixels are converted to the digital domain for further manipulation. Currently, pipelined analog-to-digital converters offer the most popular architectures for medium to high speed conversions. As one advantage, pipelined architectures can provide high throughput rates, and yet occupy a relatively small die area when compared to comparable non-pipelined architectures.

Because of non-idealities of components used to create analog-to-digital converters, redundancy is introduced into designs by making the sum of individual pipeline stages greater than the total resolution of the analog-to-digital converter. Redundancy may be introduced to any stage of a pipelined design. As just some examples, the redundancy may be introduced at the stage where the error is created by, for example, implementing a higher resolution analog-to-digital converter stage than that theoretically required. Alternatively, redundancy may be added in a subsequent stage that includes an operational range that is larger than is theoretically necessary. In a typical application, the number of comparators for a higher resolution stage is $[2^{(B+1)}-1]$ comparators, where B is the effective number of bits of the stage with redundancy. As an improvement, one reported design approach (hereinafter the "Lewis Approach") allows for the reduction of one comparator such that $[2^{(B+1)}-2]$ comparators are used. This design is discussed in "A 10-b 20-Msamples/s Analog-to-Digital Converter," Lewis et al., Journal of Solid State Circuits, Vol. 27, No. 3, March 1992.

Using the Lewis Approach, an analog-to-digital converter with two effective bits requires six comparators, three effective bits requires fourteen comparators, and four effective bits requires thirty comparators. From this, it can be appreciated that designing an analog-to-digital converter with a large number of effective bits will require a very large number of comparators. A large number of comparators requires substantial die area and consumes an appreciable amount of power.

Hence, for at least the aforementioned reasons, there exists a need in the art for advanced systems and methods for analog-to-digital conversion.

BRIEF SUMMARY OF THE INVENTION

The present invention is related to systems and methods for performing data conversions, and more particularly to systems and methods for performing analog-to-digital conversions.

Various systems and methods for converting a signal from the analog domain to the digital domain are discussed herein. As one example, a pipelined analog-to-digital converter is disclosed that includes two analog-to-digital converter stages arranged in series. The first analog-to-digital converter stage provides an encoded word output and the second analog-to-digital converter stage provides an unencoded word output. In addition, the first analog-to-digital converter stage provides an analog residue output that is provided as an input to the second analog-to-digital converter stage. The second analog-to-digital converter stage is operable to convert the analog residue output to the unencoded word output. A summation device is provided to aggregate the encoded word output with the unencoded word output.

In some cases, the first analog-to-digital converter stage is a 2.3 bit analog-to-digital converter stage. In such cases, the encoded word output is a four bit encoded word output, and the unencoded word output is a two bit unencoded word output. In particular cases, the four bit encoded word output represents five levels. The five levels are represented by the following word outputs: first level '0000', second level '0011', third level '0110', fourth level '11001', and fifth level '1100'.

In particular cases, the pipelined analog-to-digital converter includes three or more stages including two 2.3 bit analog-to-digital converters in series followed by the two bit analog-to-digital converter providing the two bit unencoded word output. In such a case, the summation device is operable to shift the encoded word output from the first 2.3 bit analog-to-digital conversion stage to the left two positions, and to aggregate both of the encoded word outputs together with the two bit unencoded word output.

In some cases, the 2.3 bit analog-to-digital converter stage is formed of a 2.3 bit analog-to-digital converter that is electrically coupled to an analog voltage input, and is operable to provide a raw data word and the encoded word output—each of which are representative of the analog voltage input less a residue. In addition, the 2.3 bit analog-to-digital converter stage includes a digital to analog converter that receives the raw data word as an input, and is operable to provide an analog output representative of the analog voltage input less the residue. A summation device and an amplifier are also included as part of the 2.3 bit analog-to-digital converter stage. The summation device is configured to subtract the analog output of the digital to analog converter from the analog voltage input to form an analog residue output. The amplifier is operable to receive and amplify the analog residue output. In some cases, the 2.3 bit analog-to-digital converter includes four comparators and an encoder.

Other embodiments of the present invention provide methods for implementing an analog-to-digital converter. The methods include providing an analog-to-digital converter stage that includes an encoded word output, another analog-to-digital converter stage that includes an unencoded word output, and a summation device. A residue from the analog-to-digital converter stage that includes an encoded word output is electrically coupled to an input port of the other analog-to-digital converter stage, and the unencoded output of this latter stage represents the received residue. In addition, the method includes adding the encoded word output with the unencoded word output using the summation device.

Yet other embodiments of the present invention provide pipelined analog-to-digital converters. These pipelined analog-to-digital converters include at least one two bit, four comparator analog-to-digital converter stage driving a subsequent two bit analog-to-digital converter stage. The two bit, four comparator analog-to-digital converter stage provides an encoded word output representing five successive levels, along with an analog residue output. The two bit analog-to-digital converter stage receives the analog residue output and provides a two bit unencoded word representative of the analog residue output. The pipelined analog-todigital converters further include a summation device that is operable to aggregate the encoded word output with the two bit unencoded word.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for performing data conversions, and more particularly to systems and methods for performing analog-to-digital conversions.

Various systems and methods for converting a signal from the analog domain to the digital domain are discussed herein. As one example, a pipelined analog-to-digital converter is disclosed that includes two analog-to-digital converter stages arranged in series. The first analog-to-digital converter stage provides an encoded word output and the second analog-to-digital converter stage provides an unencoded word output. As used herein, the phrase "encoded word" is defined to be a data set that represents a group of levels, and that is not incremented by a single least significant bit upon transitioning from one level to the next sequential level. Thus, as an example, where a four bit encoded word is used to represent five levels, the five levels may be represented by the following sequence of four bit encoded data words: first level '0000', second level '0011', third level '0110', fourth level '1001', and fifth level '11100'. In contrast, the phrase "unencoded word" is defined to be a data set that represents a group of levels, and that is incremented by a single least significant bit upon transitioning from one level to the next sequential level. Thus, as an example, where a two bit unencoded word is used to represent four levels, the four levels may be represented by the following sequence of two bit unencoded data words: first level '00', second level '01', third level '10', and fourth level '11'. Based on the disclosure provided herein, one of ordinary skill in the art will recognize a variety of encoded and unencoded word outputs that may be used in relation to one or more embodiments of the present invention.

In addition, the first analog-to-digital converter stage provides an analog residue output that is provided as an input to the second analog-to-digital converter stage. The second analog-to-digital converter stage is operable to convert the analog residue output to the unencoded word output. A summation device is provided to aggregate the encoded word output with the unencoded word output. As used herein, the term "residue" is used in its broadest sense to mean any remainder amount of an analog input that is not quantizable by an analog-to-digital converter.

Various embodiments of the present invention provide a pipelined analog-to-digital converter architecture that uses a reduced number of comparators, and thus requires less die area and power. Further, some embodiments of the invention are capable of achieving a relatively high conversion rate with less complexity than required by prior approaches to achieve comparable analog-to-digital converters. In some cases, embodiments of the present invention provide for analog-to-digital conversion using approximately one half of the comparators required by other approaches. As a particular example, a two bit analog-to-digital converter in accordance with one or more embodiments of the present invention may be implemented using just four comparators, rather than the six comparators required by the aforementioned Lewis Approach. A three bit analog-to-digital converter in accordance with other embodiments of the present invention may be implemented using just eight comparators, rather than the fourteen comparators required by the aforementioned Lewis Approach; and a four bit analog-to-digital converter in accordance with yet other embodiments of the present invention may be implemented using just sixteen comparators, rather than the thirty comparators required by the aforementioned Lewis Approach. Based on the disclosure provided herein, one of ordinary skill in the art will appreciate that the aforementioned analog-to-digital converters offering two, three and four effective bits are merely exemplary, and that other sizes of analog-to-digital converters are possible in accordance with embodiments of the present invention.

Figure 1:
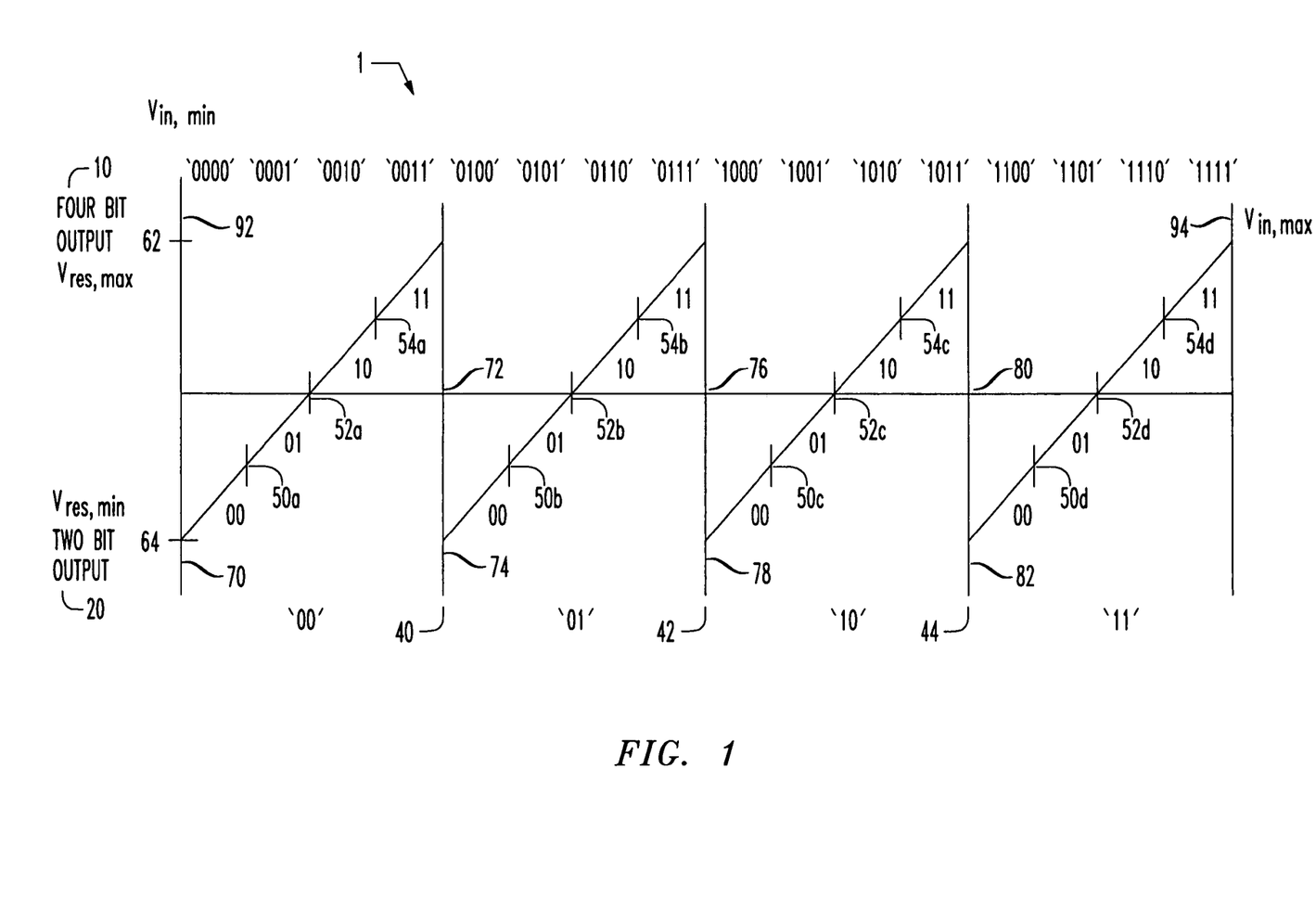
FIG. 1 is a residue plot for a two bit analog-to-digital converter without redundancy that may be used in relation to one or more embodiments of the present invention.

Turning to FIG. 1, operation of a three comparator, two bit analog-to-digital converter without redundancy is described in relation to a residue plot 1. Considering residue plot 1, a residue value is represented by segments 70, 72, 74, 76, 78, 80, 82 as an analog input value extends from its minimum value (Vin, min) 92 on the left end of plot 1 to its maximum value (Vin, max) 94 on the right end of plot 1. As the analog input value moves from its minimum to its maximum, the residue value moves between a minimum residue value (Vres, min) 64 of zero, to its maximum residue value (Vres, max) 62. The maximum residue value is approximately the voltage range between adjacent comparators.

A two bit output 20, a four bit output 10, and a number of individual thresholds 40, 42, 44, 50, 52 and 54 are shown as part of residue plot 1 for explanation purposes. Two bit output 20 represents the digital output of the immediate stage, and four bit output 10 represents the digital output of the analog-to-digital converter after the residue is resolved by a subsequent stage. Thresholds 40, 42 and 44 represent the three comparators of the immediate stage, and thresholds 50, 52 and 54 are representative of the comparators of the subsequent stage. In some cases, the output of the prior stage is amplified, while in other cases the output of the prior stage is driven directly into the subsequent stage. Based on the disclosure provided herein, one of ordinary skill in the art will recognize that whether amplification is used or not will affect the thresholds of the receiving stage. Each of thresholds 50, 52 and 54 are associated with levels ('00', '01', '10', '11') that are placed on residue plot 201 above and below the aforementioned thresholds. Four bit output 210 is created by shifting two bit output 20 left two positions, and adding the levels associated with thresholds 50, 52 and 54 without shifting.

Following residue plot 1, operation of the three comparator, two bit analog-to-digital converter is described in relation to an analog input voltage that is ramped smoothly between minimum level 92 and maximum level 94. As the analog input voltage begins at minimum level 92 and traverses approximately one quarter of its range along curve 70 until it reaches threshold 40 of the first comparator, the residue value moves from its minimum 64 to its maximum 62 while two bit output 20 of the immediate stage remains '00'. Along curve 70, the residue passes through thresholds 50a, 52a and 54a. At these increments the level values provided by the subsequent two-bit analog-to-digital converter change from '00' to '01', from '01' to '10', and from '10' to '11', respectively. These level values are added to left shifted two bit output 20 to achieve four bit output 10 values of: '0000', '0001', '0010' and '0011', respectively.

Once the analog input voltage equals threshold 40, the residue value returns to its minimum 62 along curve 72; and from there continues to increase in value along curve 74 until threshold 42 of the second comparator is achieved. Along curve 74, the residue passes through thresholds 50b, 52b and 54b while two bit value 20 remains at '01'. At these increments the level values provided by the subsequent two-bit analog-to-digital converter change from '00' to '01', from '01' to '10', and from '10' to '11', respectively. These level values are added to left shifted two bit output 20 to achieve four bit output 10: '0100', '0101', '0110' and '0111', respectively.

Once the analog input voltage equals threshold 42, the residue value returns to its minimum 62 along curve 76; and from there continues to increase in value along curve 78 until threshold 44 of the third comparator is achieved. Along curve 78, the residue passes through thresholds 50c, 52c and 54c while two bit value 20 remains at '10'. At these increments the level values provided by the subsequent two-bit analog-to-digital converter change from '00' to '01', from '01' to '10', and from '10' to '11', respectively. These level values are added to left shifted two bit output 20 to achieve four bit output 10: '1000', '1001', '1010' and '1011', respectively.

Once the analog input voltage equals threshold 44, the residue value returns to its minimum 62 along curve 80; and from there continues to increase in value along curve 82 until it achieves maximum level 94. Along curve 82, the residue passes through thresholds 50d, 52d and 54d while two bit value 20 remains at '11'. At these increments the level values provided by the subsequent two-bit analog-to-digital converter change from '00' to '01', from '01' to '10', and from '10' to '11', respectively. These level values are added to left shifted two bit output 20 to achieve four bit output 10: '1100', '1101', '1110' and '1111', respectively.

As will be appreciated by one of ordinary skill in the art, such a three comparator, two bit analog-to-digital converter does not provide redundancy, and thus cannot compensate for non-idealities of components. However, using such an analog-to-digital converter provides a reasonable understanding of analog-to-digital converter operation that can then be used to contrast the various features of embodiments of the present invention. Further, such a three comparator, two bit analog-to-digital converter may be used in some cases as a stage of one or more embodiments of the present invention.

Figure 2A:
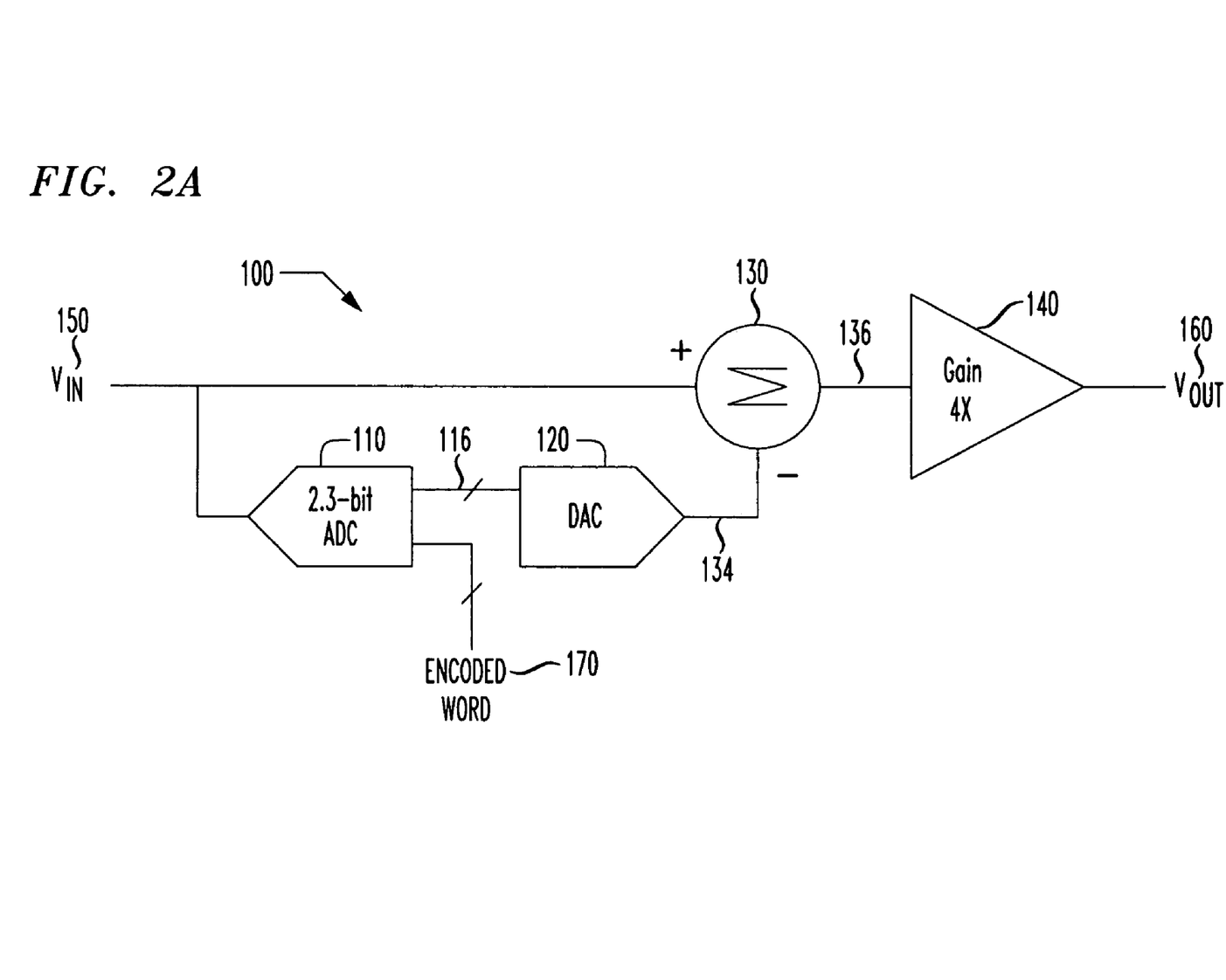
FIG. 2A shows a 2.3 bit analog-to-digital converter stage providing an encoded output in accordance with some embodiments of the present invention.

Turning to FIG. 2A, an analog-to-digital converter stage 100 in accordance with various embodiments of the present invention is shown. Analog-to-digital converter stage 100 includes a 2.3 bit analog-to-digital converter 110, a digital-to-analog converter 120, a summation device 130 and an amplifier 140. Amplifier 140 may be any amplifier known in the art that is capable of receiving an analog signal, and amplifying the received signal with a known gain, and providing an amplified output 160. Thus, as just one of many examples, amplifier 140 may be an operational amplifier capable of amplifying a received signal by a gain of four. Based on the disclosure provided herein, one of ordinary skill in the art will appreciate a variety of amplifiers that may be used in accordance with the various embodiments of the present invention.

Summation device 130 may be any device or circuit known in the art that is capable of aggregating two analog signals to make a single analog signal. In particular, summation device 130 may be configured such that two analog inputs are received 150, 134, one of the analog inputs 134 is subtracted from the other analog input 150, and an analog residue output 136 representative of the subtracted value is provided. In other words, analog residue output is the amount of analog input 150 that is not quantizable by 2.3 bit analog-to-digital converter 110. Based on the disclosure provided herein, one of ordinary skill in the art will appreciate a variety of summation devices that may be used in accordance with the various embodiments of the present invention.

Digital-to-analog converter 120 may be any conversion device or circuit known in the art that is capable of receiving a raw digital value 116, converting raw digital value 116 to an analog value representative of raw digital value 116, and providing the analog value as analog input 134 to summation device 130. Based on the disclosure provided herein, one of ordinary skill in the art will appreciate a variety of summation devices that may be used in accordance with the various embodiments of the present invention.

2.3 bit analog-to-digital converter 110 is an analog-to-digital converter providing an effective two bit analog-to-digital converter capable of receiving analog input 150, and providing raw digital value 116 representative of analog input 150. In particular, 2.3 bit analog-to-digital converter includes four quantization devices capable of distinguishing five quantization levels (i.e., Level 0–Level 4), and is defined as a 2.3 bit converter using the following equation:

$$\text{bit}=\log(Q+1)/\log(2),$$

where Q represents the number of quantization devices. In addition, 2.3 bit analog-to-digital converter 110 provides an encoded data word 170 that is representative of raw digital value 116. This is in contrast to unencoded data outputs provided by various prior art analog-to-digital converters. In the 2.3 bit implementation of the present embodiment, encoded data word 170 provides the five encoded words shown in Table 1 that represent respective quantization levels.

TABLE 1

| Quantization Level | Encoded Word |
|---|---|
| Level 0 | 0000 |
| Level 1 | 0011 |
| Level 2 | 0110 |
| Level 3 | 1001 |
| Level 4 | 1100 |

As will be noted from Table 1, the encoded data word is increased by three least significant bits for each level transition. A detailed derivation and explanation of the coding algorithm is provided at the end of this detailed discussion. Based on this discussion, one of ordinary skill in the art will recognize that three bit and larger analog-to-digital converter stages are possible by expanding the ideas presented herein. Thus, while the embodiments disclosed use a 2.3 bit analog-to-digital converter stage, it should be recognized that a corresponding analog-to-digital converter stage providing an encoded output is possible for a three bit analog-to-digital converter, as well as those of other sizes.

Figure 2B:
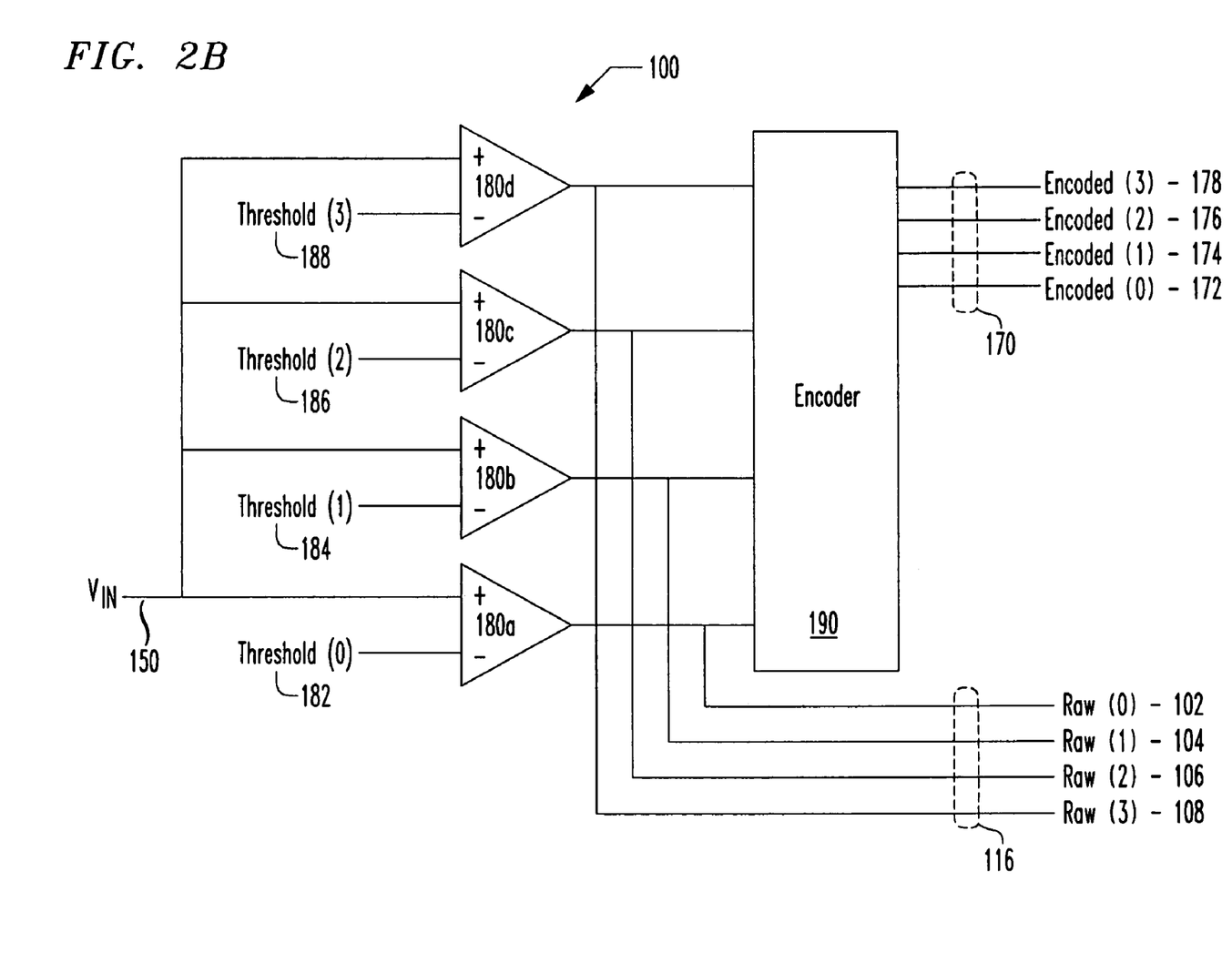
FIG. 2B shows a 2.3 bit analog-to-digital converter in acccordance with various embodiments of the present invention.

An implementation of 2.3 bit analog-to-digital converter 110 in accordance with one or more embodiments of the present invention is depicted in FIG. 2B. In the implementation, encoded word 170 is composed of four ordered bits: encoded 178, encoded 176, encoded 174 and encoded 172; and raw digital value 116 is composed of four ordered bits: raw 108, raw 106, raw 104 and raw 102. Analog-to-digital converter 110 includes four comparators 180 configured to detect the aforementioned five quantization levels. In particular, Level 0 is detected whenever analog input 150 is less than a threshold 182, Level 1 is detected whenever analog input 150 is less than a threshold 184 and greater than or equal to threshold 182, Level 2 is detected whenever analog input 150 is less than a threshold 186 and greater than or equal to threshold 184, Level 3 is detected whenever analog input 150 is less than a threshold 188 and greater than or equal to threshold 186, and Level 4 is detected whenever analog input 150 is greater than or equal to threshold 188. The data words associated with raw digital value 116 for each of the respective levels is set forth in Table 2.

TABLE 2

| Quantization Level | Raw Digital Value |
|---|---|
| Level 0 | 0000 |
| Level 1 | 0001 |
| Level 2 | 0011 |
| Level 3 | 0111 |
| Level 4 | 1111 |

Encoder 190 is operable to convert raw digital value 116 shown in Table 2 to encoded word 170 shown in Table 1. As will be appreciated by one of ordinary skill in the art, encoder 190 may include a collection of logic gates capable of making the prescribed conversion described by the following pseudo code:

If (raw digital value 116='0000')
  encoded word 170='0000';
Else If (raw digital value 116='0001')
  encoded word 170='0011';
Else If (raw digital value 116='0011')
  encoded word 170='0110';
Else If (raw digital value 116='0111')
  encoded word 170='1001';
Else
  encoded word 170='1100'.

Figure 2C:
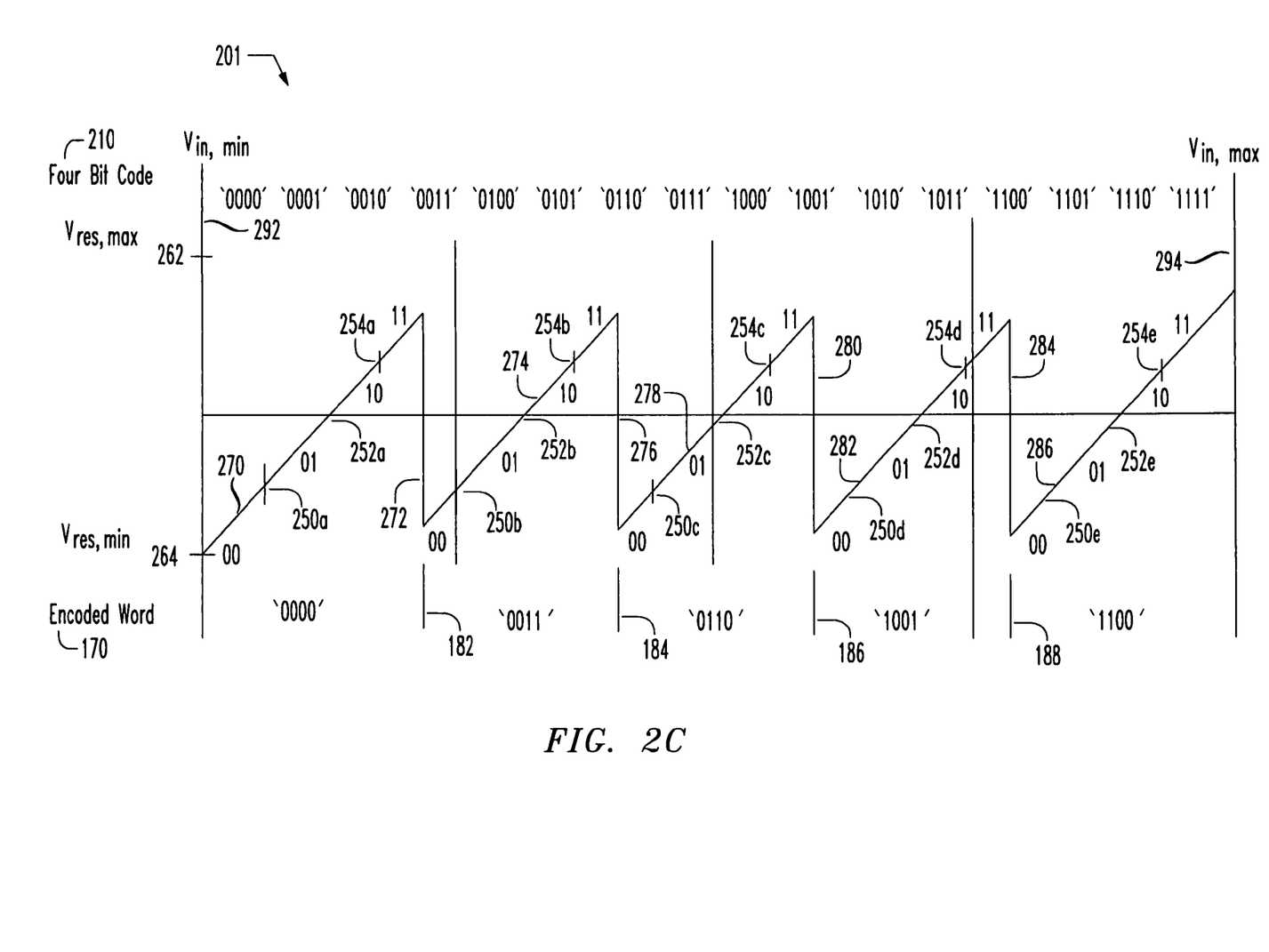
FIG. 2C is a residue plot representing the operation of the analog-to-digital converter stage of FIG. 2A augmented with a subsequent standard two bit analog-to-digital converter stage.

Turning now to FIG. 2C, operation of analog-to-digital converter stage 100 is described in relation to a residue plot 201. Considering residue plot 201, a residue value is represented by segments 270, 272, 274, 276, 278, 280, 282, 284 and 286 as analog input value 150 extends from its minimum value (Vin, min) 292 on the left end of plot 201 to its maximum value (Vin, max) 294 on the right end of plot 201. As analog input value 150 moves from its minimum to its maximum, the residue value moves between a minimum residue value (Vres, min) 264 of zero, to its maximum residue value (Vres, max) 262. The maximum residue value is approximately equal to the voltage range between adjacent comparators 180.

Encoded word 170, a four bit output 210, and a number of individual thresholds 182, 184, 186, 250, 252 and 254 are shown as part of residue plot 201 for explanation purposes. Encoded word 170 represents the digital output of the immediate stage, and four bit output 210 represents the digital output of analog-to-digital converter stage 100 after the residue is resolved by a subsequent two bit stage. Thresholds 182, 184, 186 and 188 represent the four comparators 180 of the immediate stage, and thresholds 250, 252 and 254 represent the comparators of the subsequent stage. Each of thresholds 250, 252 and 254 are associated with levels ('00', '01', '10', '11') that are placed on residue plot 201 above and below the aforementioned thresholds. Four bit output 210 is created by adding encoded word 170 to the levels associated with thresholds 250, 252 and 254.

Following residue plot 201, operation of analog-to-digital converter stage 100 is described in relation to analog input voltage 150 that is ramped smoothly between minimum level 292 and maximum level 294. As analog input voltage 150 begins at minimum level 292 and traverses approximately one fifth of its range along curve 270 until it reaches threshold 182 of comparator 180*a*, the residue value moves from its minimum 264 to its maximum 262 while encoded word remains '0000'. Along curve 270, the residue passes through thresholds 250*a*, 252*a* and 254*a*. At these increments the levels from a subsequent two bit analog-to-digital converter stage change from '00' to '01', from '01' to '10', and from '10' to '11', respectively. These level values from the subsequent two bit analog-to-digital converter stage are added directly to encoded word 170 to achieve four bit output 210 values of: '0000', '0001', '0010' and '0011', respectively.

Once analog input voltage 150 equals threshold 182, the residue value returns to its minimum 262 along curve 272; and from there continues to increase in value along curve 274 until threshold 184 of comparator 180*b* is achieved. Along curve 274, the residue passes through thresholds 250*b*, 252*b* and 254*b* while encoded word 170 remains at '0011'. At these increments the level values from the subsequent two bit analog-to-digital converter stage change from '00' to '01', from '01' to '10', and from '10' to '11', respectively. These level values from the subsequent two bit analog-to-digital converter stage are added directly to encoded word 170 to achieve four bit output 210 values of: '0011', '0100', '0101' and '0110', respectively.

Once analog input voltage 150 equals threshold 184, the residue value returns to its minimum 262 along curve 276; and from there continues to increase in value along curve 278 until threshold 186 of comparator 180c is achieved. Along curve 278, the residue passes through thresholds 250c, 252c and 254c while encoded word 170 remains at '0110'. At these increments the level values from the subsequent two bit analog-to-digital converter stage change from '00' to '01', from '01' to '10', and from '10' to '11', respectively. These level values from a subsequent two bit analog-to-digital converter stage are added directly to encoded word 170 to achieve four bit output 210 values of: '0110', '0111', '1000' and '1001', respectively.

Once analog input voltage 150 equals threshold 186, the residue value returns to its minimum 262 along curve 280; and from there continues to increase in value along curve 282 until threshold 188 of comparator 180d is achieved. Along curve 282, the residue passes through thresholds 250d, 252d and 254d while encoded word 170 remains at '1001'. At these increments the level values from the subsequent two bit analog-to-digital converter stage change from '00' to '01', from '01' to '10', and from '10' to '11', respectively. These level values from a subsequent two bit analog-to-digital converter stage are added directly to encoded word 170 to achieve four bit output 210 values of: '1001', '1010', '1011' and '1100', respectively.

Once analog input voltage 150 equals threshold 188, the residue value returns to its minimum 262 along curve 284; and from there continues to increase in value along curve 286 until maximum 294 is achieved. Along curve 286, the residue passes through thresholds 250e, 252e and 254e while encoded word 170 remains at '1100'. At these increments the level values from the subsequent two bit analog-to-digital converter stage change from '00' to '01', from '01' to '10', and from '10' to '11', respectively. These level values from a subsequent two bit analog-to-digital converter stage are added directly to encoded word 170 to achieve four bit output 210 values of: '1100', '1101', '1110' and '1111', respectively.

As will be appreciated by one of ordinary skill in the art upon considering residue plot 201, the transition of four bit word 218 do not occur at the threshold of comparators 180. This is because of the redundancy built into the circuit. This redundancy assumes that an accurate output is provided on four bit output 210 even where a particular comparator 180 exhibits some level of non-ideal behavior. It should be noted that there is a relationship between the number of comparators used in an analog-to-digital converter stage and the achievable correction range or redundancy. In particular, a reduced number of comparators leads to a corresponding reduction in the correction range. Some embodiments of the present invention use only $2^B$ comparators compared to the $2^{B+1}-2$ comparators of analog-to-digital converter stages known in the art. Thus, while embodiments of the present invention utilize fewer comparators and offer the associated advantages, they also exhibit a reduced correction range. This reduction in correction range, however, is typically not a limitation.

Figure 3:
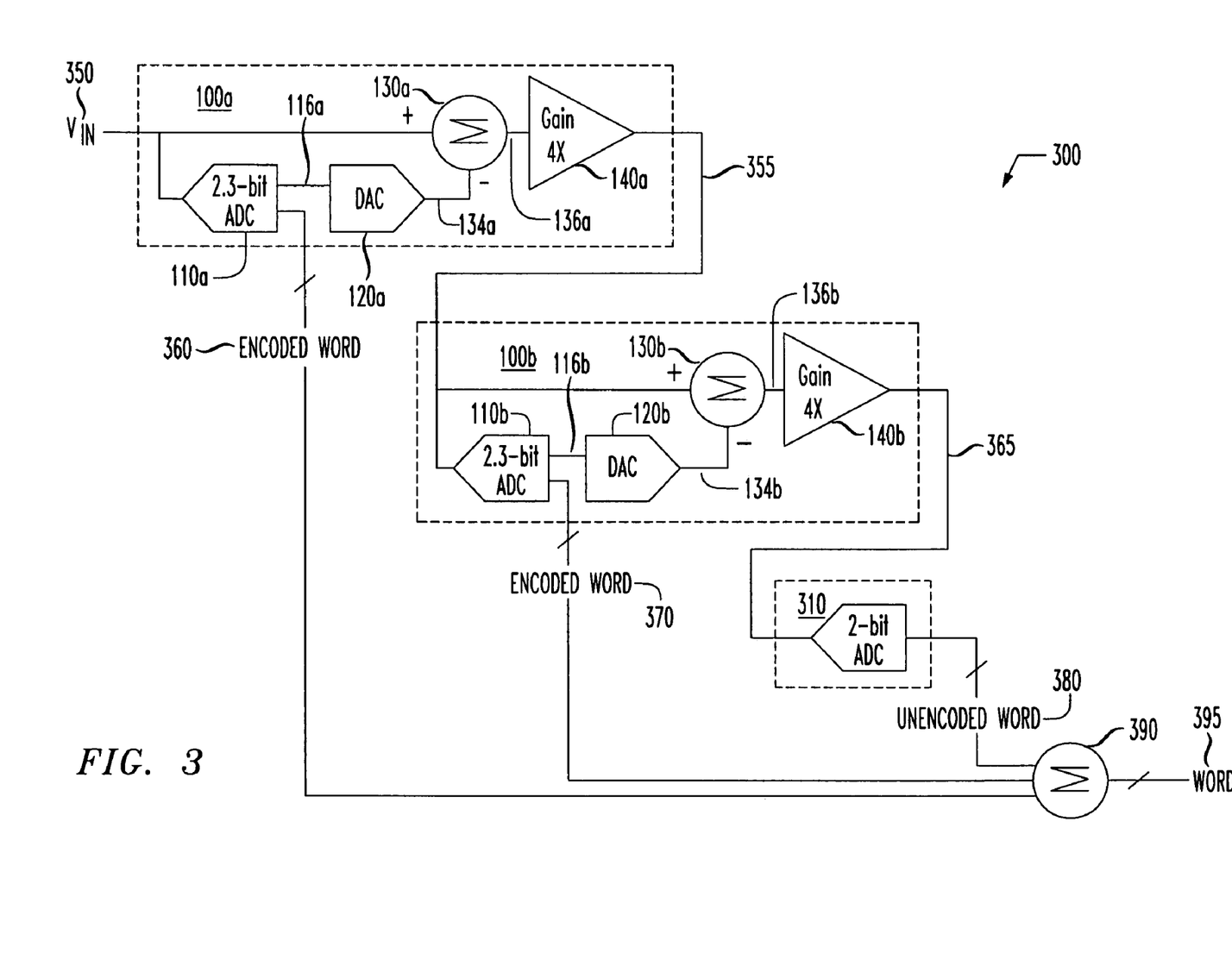
FIG. 3 shows a three stage pipelined analog-to-digital converter using two digital converter stages depicted in FIG. 2A above, and in accordance with some embodiments of the present invention.

Turning now to FIG. 3, a pipelined analog-to-digital converter 300 in accordance with one or more embodiments of the present invention is depicted. Pipelined analog-to-digital converter 300 includes two analog-to-digital converter stages 100 outlined by a dashed line. Analog-to-digital converter stages 100 are arranged in series, and are followed by a standard two bit analog-to-digital converter 310. As will be appreciated from the following discussion, pipelined analog-to-digital converter 300 provides sufficient redundancy to eliminate the effects of non-ideal components, and yet only requires four comparators. This stands in stark contrast to existing 2.8 bit analog-to-digital converters that typically require six comparators. Thus, as just some of various advantages, one or more embodiments of the present invention may provide conversion capability comparable to other analog-to-digital converters using less die area and consuming less power when compared with other two bit analog-to-digital converters that include redundancy. Further, some embodiments of the present invention may provide for simplified correction logic testability. Yet further, some embodiments of the present invention may provide for a reduced capacitive load when compared to other two bit analog-to-digital converters. Yet further, some embodiments of the present invention allow for incorporated digital-to-analog converters to have fewer levels. This may allow for faster digital-to-analog converters which are less sensitive to the capacitor ratio than other two bit analog-to-digital converters.

An analog value 350 is provided at the input of 2.3 bit analog-to-digital converter stage 100a, and an analog residue output 355 is provided to the input of 2.3 bit analog-to-digital converter stage 100b. An analog residue output 365 of 2.3 bit analog-to-digital converter stage 100b is provided as an input to standard two bit analog-to-digital converter 310. An encoded word 360 from 2.3 bit analog-to-digital converter stage 100a and an encoded word 370 from 2.3 bit analog-to-digital converter stage 100b are provided to a summation device 390. In addition, an unencoded two bit word 380 from standard two bit analog-to-digital converter 310 is provided to summation device 390. The aggregate of encoded word 360, encoded word 370 and unencoded two bit word 380 is provided as a digital output 395 representing analog value 350. It should be noted that standard two bit analog-to-digital converter 310 may be any analog-to-digital converter that provides an output that is not encoded. Thus, for example, standard analog-to-digital converter 310 may be, but is not limited to, a standard 2.8 bit analog-to-digital converter using six comparators and providing a two bit output that increments from zero to three through conversion of the following seven level values quantized using six comparators: 000, 001, 010, 011, 100, 101, 110. Alternatively or in addition, standard analog-to-digital converter 310 may be the three comparator, two bit analog-to-digital converter discussed above in relation to FIG. 1. Based on the disclosure provided herein, one of ordinary skill in the art will appreciate that other two bit analog-to-digital converters may be used in place of standard analog-to-digital converter 310.

In operation, pipelined analog-to-digital converter 300 receives analog input 350. Analog input 350 is provided to 2.3 bit analog-to-digital converter 110a, and to summation device 130a. Analog-to-digital converter 10a provides raw digital value 116a, which represents analog input 350 less a residue. This residue is primarily caused by a limited resolution of the analog-to-digital converter. Thus, as an example, where analog input 350 is three-quarters volt and analog-to-digital converter 10a is capable of quantization in half volt increments, the residue will be one quarter volt. In addition, 2.3 bit analog-to-digital converter 110a provides encoded word 360 that is representative of raw digital value 116a.

Raw digital value 116a is re-converted to the analog domain by digital-to-analog converter 120a. Digital-to-analog converter 120a provides analog input 134a which is a representation of analog input 350 less the residue. Analog input 134a is then subtracted from analog input 350 which results in analog residue output 136a. As will be appreciated, analog residue output 136a is the residue that is not quantizable by analog-to-digital converter 110a. This residue is provided to amplifier 140a where it is amplified and provided as a residue output 355.

In some cases, amplifier 140 is designed with a gain sufficient to take advantage of the full range of a subsequent analog-to-digital conversion stage. Thus, for example, where the maximum residue value is one volt, and the range of the subsequent analog-to-digital conversion stage is four volts, the gain of amplifier may be selected as four. Based on the disclosure provided herein, one of ordinary skill in the art will recognize a variety of designs that are achievable in accordance with embodiments of the present invention, and amplifier gains that would be suitable for use in relation to such designs.

Residue output 355 is provided as the input to 2.3 bit analog-to-digital converter stage 100b where it is received by both 2.3 bit analog-to-digital converter 110b, and by summation device 130b. Analog-to-digital converter 110b provides raw digital value 116b, which represents residue output 355 less a residue. In addition, 2.3 bit analog-to-digital converter 110b provides encoded word 370 that is representative of raw digital value 116b.

Raw digital value 116b is re-converted to the analog domain by digital-to-analog converter 120b. Digital-to-analog converter 120b provides analog input 134b which is a representation of residue output 355 less the residue. Analog input 134b is then subtracted from residue output 355 which results in analog residue output 136b. Analog residue output 136b is provided to amplifier 140b where it is amplified and provided as a residue output 365.

Residue output 365 is provided to standard two bit analog-to-digital converter 310 where it is converted to unencoded two bit word 380. Encoded word 360, encoded word 370, and unencoded two bit word 380 are provided to summation device 390 where they are aggregated. The aggregation includes shifting encoded word 360 left two bits prior to aggregating. The following equation demonstrates the operation of summation device 390 where encoded word 360 is represented as four X's, encoded word 370 is represented as four Y's, and unencoded two bit word 380 is represented as two Z's:

$$
\begin{array}{cccccc}
X & X & X & X & & \\
 & & Y & Y & Y & Y \\
 & & & & Z & Z \\
\hline
D5 & D4 & D3 & D2 & D1 & D0
\end{array}
$$

Based on the disclosure provided herein, one of ordinary skill in the art will appreciate that analog-to-digital converters using two or more 2.3 bit analog-to-digital conversion stages may be utilized depending upon the desired resolution of the analog-to-digital conversion. Thus, where the aforementioned example provides six bits of resolution, it can be appreciated that adding an additional stage would provide eight bits of resolution.

Figure 4:
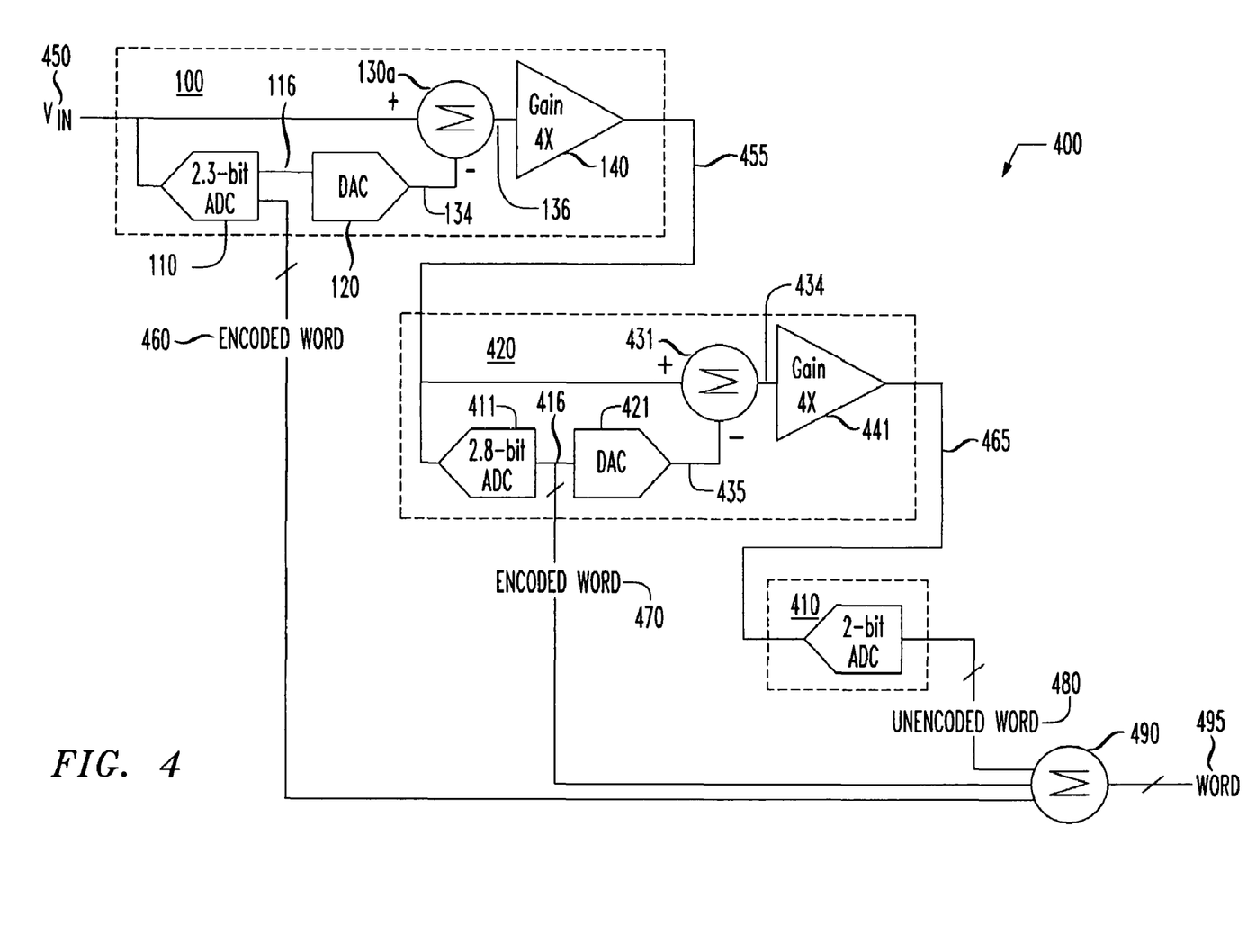
FIG. 4 depicts a three stage pipelined analog-to-digital converter using one digital converter stage depicted in FIG. 2A above, and in accordance with particular embodiments of the present invention.

Turning now to FIG. 4, a pipelined analog-to-digital converter 400 in accordance with some embodiments of the present invention is depicted. Pipelined analog-to-digital converter 400 includes one 2.3 bit analog-to-digital converter stage 100 outlined by a dashed line. 2.3 bit analog-to-digital converter stage 100 feeds a 2.8 bit analog-to-digital converter stage 420 known in the art, which in turn feeds a standard two bit analog-to-digital converter stage 410.

An analog value 450 is provided at the input of 2.3 bit analog-to-digital converter stage 100, and an analog residue output 455 is provided to the input of 2.8 bit analog-to-digital converter stage 420. An analog residue output 465 of 2.8 bit analog-to-digital converter stage 420 is provided as an input to standard two bit analog-to-digital converter 410. An encoded word 460 from 2.3 bit analog-to-digital converter stage 100 and an unencoded word 370 from 2.8 bit analog-to-digital converter stage 420 are provided to a summation device 490. In addition, an unencoded two bit word 480 from standard two bit analog-to-digital converter 410 is provided to summation device 490. The aggregate of encoded word 460, unencoded three bit word 470 and unencoded two bit word 480 is provided as a digital output 495 representing analog value 450. It should be noted that standard two bit analog-to-digital converter 410 may be any analog-to-digital converter that provides an output that is not encoded. Thus, for example, standard analog-to-digital converter 310 may be, but is not limited to, another 2.8 bit analog-to-digital converter providing the following sequential output: '00', '01', '10', '11'. Alternatively or in addition, standard analog-to-digital converter 410 may be the three comparator, two bit analog-to-digital converter discussed above in relation to FIG. 1.

In operation, pipelined analog-to-digital converter 400 receives analog input value 450. Analog input value 450 is provided to 2.3 bit analog-to-digital converter 110, and to summation device 130. Analog-to-digital converter 110 provides raw digital value 116, which represents analog input 450 less a residue. In addition, 2.3 bit analog-to-digital converter 110 provides encoded word 460 that is representative of raw digital value 116.

Raw digital value 116 is re-converted to the analog domain by digital-to-analog converter 120. Digital-to-analog converter 120 provides analog input 134 which is a representation of analog input 450 less the residue. Analog input 134 is then subtracted from analog input 450 which results in analog residue output 136. Analog residue output 136 is provided to amplifier 140 where it is amplified and provided as residue output 455.

Residue output 455 is provided as the input to 2.8 bit analog-to-digital converter stage 420 where it is received by both 2.8 bit analog-to-digital converter 411, and by summation device 431. Analog-to-digital converter 411 provides raw digital value 416, which represents residue output 455 minus a residue. In addition, 2.8 bit analog-to-digital converter 420 provides unencoded three bit word 470 that is representative of raw digital value 416.

Raw digital value 416 is re-converted to the analog domain by a digital-to-analog converter 421. Digital-to-analog converter 421 provides an analog input 435 which is a representation of residue output 455 less any residue. Analog input 435 is then subtracted from residue output 455 which results in an analog residue output 437. Analog residue output 437 is provided to amplifier 441 where it is amplified and provided as a residue output 465.

Residue output 465 is provided to standard two bit analog-to-digital converter 410 where it is converted to unencoded two bit word 480. Encoded word 460, unencoded three bit word 470, and unencoded two bit word 480 are provided to summation device 490 where they are aggregated. The aggregation includes shifting encoded word 460 and unencoded word 470 left two bits prior to aggregating. The following equation demonstrates the operation of summation device 490 where encoded word 460 is represented as four X's, unencoded three bit word 470 is represented as three Y's, and unencoded two bit word 480 is represented as two Z's:

$$\begin{array}{cccccc} X & X & X & X & & \\ & Y & Y & Y & & \\ & & & Z & Z & \\ \hline D5 & D4 & D3 & D2 & D1 & D0 \end{array}$$

Figure 5:
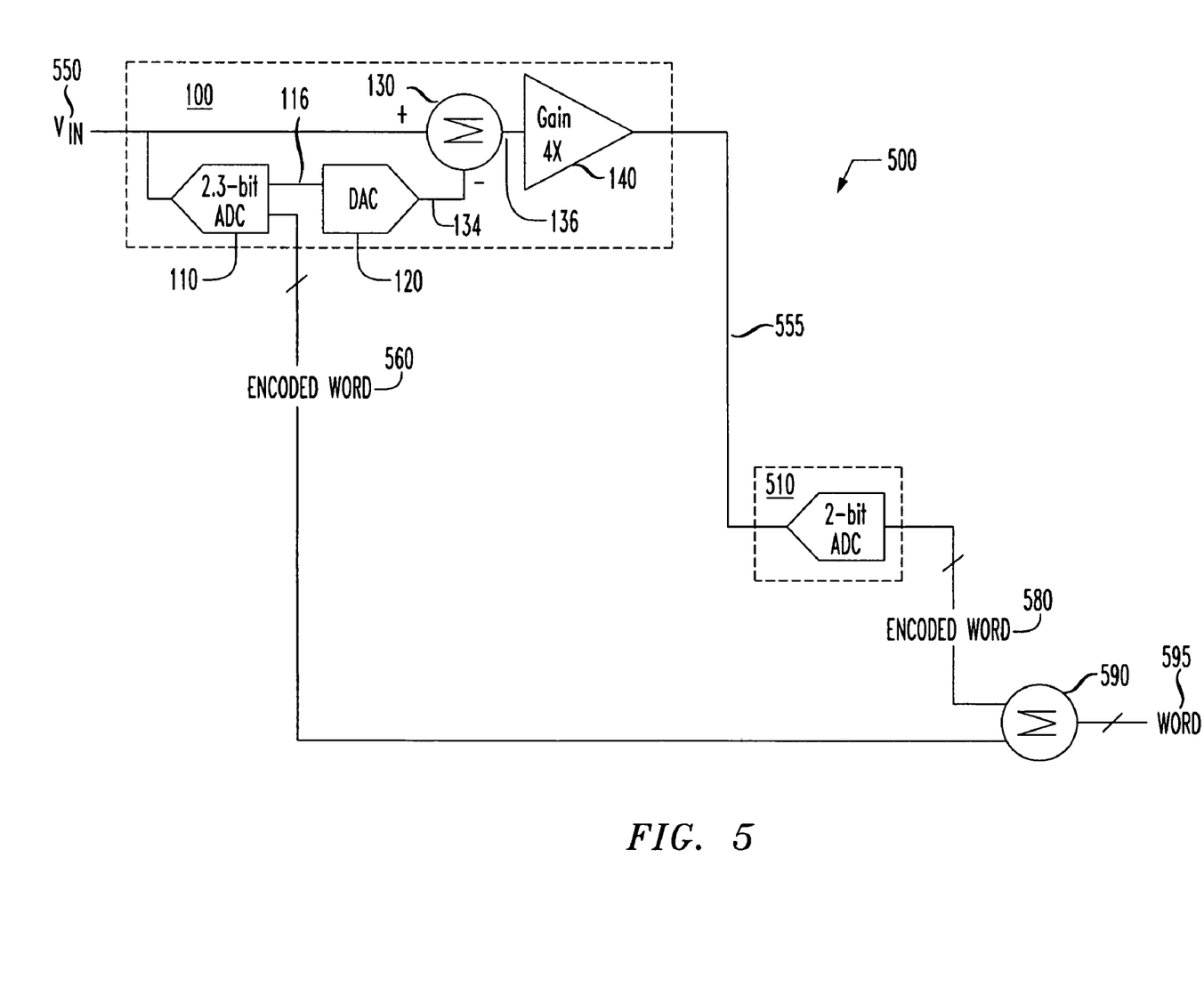
FIG. 5 shows a two stage pipelined analog-to-digital converter using one digital converter stage depicted in FIG. 2A above, and in accordance with on or more embodiments of the present invention.

Turning now to FIG. 5, a pipelined analog-to-digital converter 500 in accordance with other embodiments of the present invention is depicted. Pipelined analog-to-digital converter 500 includes one 2.3 bit analog-to-digital converter stage 100 outlined by a dashed line. 2.3 bit analog-to-digital converter stage 100 feeds a single standard two bit analog-to-digital converter stage 510.

An analog value 550 is provided at the input of 2.3 bit analog-to-digital converter stage 100, and an analog residue output 555 is provided to the input of standard two bit analog-to-digital converter 510. An encoded word 560 from 2.3 bit analog-to-digital converter stage 100 and an unencoded two bit word 580 from standard two bit analog-to-digital converter 510 are provided to a summation device 590. The aggregate of encoded word 560 and unencoded two bit word 580 is provided as a digital output 595 representing analog value 550. It should be noted that standard two bit analog-to-digital converter 510 may be any analog-to-digital converter that provides an output that is not encoded. Thus, for example, standard analog-to-digital converter 510 may be, but is not limited to, another 2.8 bit analog-to-digital converter providing the following sequential output: '00', '01', '10', '11'. Alternatively or in addition, standard analog-to-digital converter 510 may be the three comparator, two bit analog-to-digital converter discussed above in relation to FIG. 1.

In operation, pipelined analog-to-digital converter 500 receives analog input value 550. Analog input value 550 is provided to 2.3 bit analog-to-digital converter 110, and to summation device 130. Analog-to-digital converter 110 provides raw digital value 116, which represents analog input 550 less a residue. In addition, 2.3 bit analog-to-digital converter 110 provides encoded word 560 that is representative of raw digital value 116.

Raw digital value 116 is re-converted to the analog domain by digital-to-analog converter 120. Digital-to-analog converter 120 provides analog input 134 which is a representation of analog input 550 less the residue. Analog input 134 is then subtracted from analog input 550 which results in analog residue output 136. Analog residue output 136 is provided to amplifier 140 where it is amplified and provided as a residue output 555.

Residue output 555 is provided as the input to standard two bit analog-to-digital converter 510 where it is converted to unencoded two bit word 580. Encoded word 560 and unencoded two bit word 580 are provided to summation device 590 where a direct aggregation is performed. The following equation demonstrates the operation of summation device 590 where encoded word 560 is represented as four X's and unencoded two bit word 580 is represented as two Z's:

$$\begin{array}{cccc} X & X & X & X \\ & & Z & Z \\ \hline D3 & D2 & D1 & D0 \end{array}$$

Figure 6:
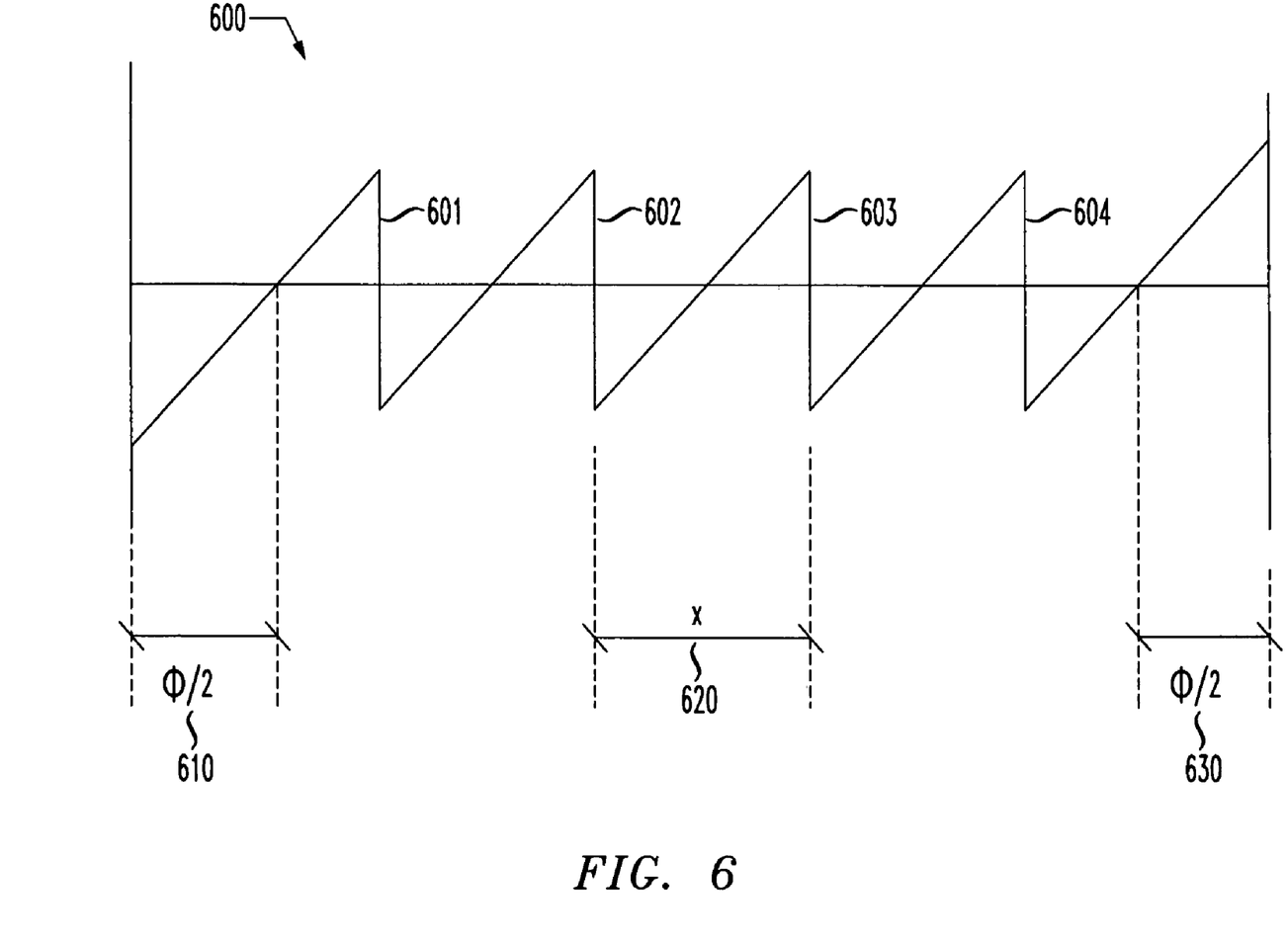
FIG. 6 is an exemplary residue plot provided as an aid to understanding a disclosed mathematical derivation.

As previously mentioned, it is possible to design analog-to-digital converter stages that are greater than two effective bits using an encoded word output to reduce comparator count. The following mathematic proof based on an exemplary residue plot 600 of FIG. 6 points out the design considerations of such higher resolution stages. Referring to residue plot 600, it is assumed that the full scale range of the desired analog-to-digital converter is $2^B$ least significant bits, where B is the effective number of bits. In addition, it is assumed that there are Q quantization elements, and that the threshold difference between quantization elements is x least significant bits. In the case of exemplary residue plot 600, x is shown as element 620, and there are four quantization elements represented by vertical lines 601, 602, 603, 604. In addition, it is assumed that the two ends of exemplary residue plot 600 have a range of $\Phi/2$ (elements 610, 630 on exemplary residue plot 600). It should be noted that (D may be different from x. In such a case, the following equation is satisfied:

$Q*x=2^B-\Phi$.

Thus, x is defined by the following equation:

$x=(2^B-\Phi)/Q$.

Again, as x is to be coded in binary codes with a finite number of bits without losing any information, x may be expressed as:

$x=(2^B-\Phi)/Q=L/2K$, where K and L are non-negative integers.

K is the number of redundant bits (i.e., the number of bits of resolution required by a subsequent back-end analog-to-digital converter), and L is the spacing between two adjacent encoded word values. It should be noted that the stage following a 2.3 analog to digital converter stage does not necessarily need to be a two effective bit stage as long as the summed resolution of the following stages is two or greater. Also, in some cases, $\Phi$ is assumed to be one least significant bit in order to avoid the potential of overdriving. However, it should be noted that $\Phi$ may take on many different values without necessarily overdriving. $\Phi$ may also be able to be encoded in binary codes with a finite number of bits without losing information and it can be expressed as $n/2^m$, when 'n' and 'm' are non-negative integers. Based on the preceding discussion, the following Table 3 provides some exemplary design constraints for different values of B (i.e., effective bit count).

TABLE 3

| B | Q | x | K | L |
|---|----|-----|---|---|
| 2 | 3  | 1   | 0 | 1 |
|   | 4  | 3/4 | 2 | 3 |
|   | 6  | 1/2 | 1 | 1 |
|   | 8  | 3/8 | 3 | 3 |
|   | 12 | 1/4 | 2 | 1 |
| 3 | 7  | 1   | 0 | 1 |
|   | 14 | 1/2 | 1 | 1 |
|   | 28 | 1/4 | 1 | 2 |

It should be noted that Table 3 shows only some of the possible values for two effective bit and three effective bit analog-to-digital converter stages. It should also be noted that the corresponding raw code should be (B+K) bits, and that L is the spacing between encoded word values such that raw code spacing is L least significant bits on a (B+K) level. Thus, for example, where Q is equal to four, the raw code of a 2.3-bit analog-to-digital converter stage is a four bit binary code and the code spacing is three least significant bits on a four bit level.

Further, it should be noted that many possible combinations are possible and included herein as different embodiments of the present invention. However, as would be expected, different embodiments of the present invention will be more desirable than others based on practical and economic considerations.

In conclusion, the present invention provides novel systems, methods and arrangements for analog-to-digital conversion. While detailed descriptions of one or more embodiments of the invention have been given above, various alternatives, modifications, and equivalents will be apparent to those skilled in the art without varying from the spirit of the invention. As one example, various systems including a series of two or more analog to digital converter stages are described in the detailed description as having a first analog to digital converter stage. In some cases, the use of the word "first" in such a description implies order with the first being a beginning of the conversion stage. In contrast, the use of the words "first", "second", and the like in the claims does not by itself imply order, but rather are used to differentiate one similar claim element from another in much the same way the words "one" and "another" would be used. Therefore, the above description should not be taken as limiting the scope of the invention, which is defined by the appended claims.

What is claimed is:

1. An analog-to-digital converter, the analog-to-digital converter comprising:
   a preceding analog-to-digital converter stage, wherein the preceding analog-to-digital converter stage is a 2.3 bit analog to digital converter stage, and wherein the preceding analog-to-digital converter stage provides an encoded word output and an analog residue output; and
   a subsequent analog-to-digital converter stage, wherein the subsequent analog-to-digital converter stage provides an unencoded word output, and wherein the subsequent analog-to-digital converter stage is electrically coupled to the analog residue output of the preceding analog-to-digital converter stage.

2. The analog-to-digital converter of claim 1, wherein the analog-to-digital converter further comprises:
   a summation device, wherein the summation device receives the encoded word output and the unencoded word output, and wherein the summation device is operable to aggregate the unencoded word output and the encoded word output.

3. The analog-to-digital converter of claim 1, wherein the unencoded word output is representative of the analog residue output provided by the preceding analog-to-digital converter stage.

4. The analog-to-digital converter of claim 1, wherein the encoded word output is a four bit encoded word output, and wherein the unencoded word output is a two bit unencoded word output.

5. The analog-to-digital converter of claim 4, wherein the 2.3 bit analog-to-digital converter stage is a preceding 2.3 bit analog-to-digital converter stage, wherein the preceding 2.3 bit analog-to-digital converter stage provides a first analog residue output, wherein the four bit encoded word output is a first four bit encoded word output, and wherein the analog-to-digital converter further comprises:
   a subsequent 2.3 bit analog-to-digital converter stage, wherein the subsequent 2.3 bit analog-to-digital converter stage provides a second four bit encoded word output, and wherein the subsequent 2.3 bit analog-to-digital converter stage provides a second analog residue output; and
   wherein the second analog residue output is provided to the preceding analog-to-digital converter stage as an input.

6. The analog-to-digital converter of claim 5, wherein the analog-to-digital converter further comprises:
   a summation device, wherein the summation device receives the first four bit encoded word output, the second four bit encoded word output and the two bit unencoded word output, wherein the summation device is operable to shift the second four bit encoded word output left two positions to create a shifted four bit encoded word output, and wherein the summation device is operable to aggregate the first four bit encoded word output, the shifted four bit encoded word output and the two bit unencoded word output.

7. The analog-to-digital converter of claim 4, wherein the 2.3 bit analog-to-digital converter stage provides a first analog residue output, wherein the two bit unencoded word output is a first unencoded word output, and wherein the analog-to-digital converter further comprises:
   a 2.8 bit analog-to-digital converter stage, wherein the 2.8 bit analog-to-digital converter stage provides a second two bit unencoded word output, wherein the 2.8 bit analog-to-digital converter stage provides a second analog residue output, and wherein the 2.8 bit analog-to-digital converter stage receives the first analog residue output as an input; and
   wherein the second analog residue output is provided to the second analog-to-digital converter stage as an input.

8. The analog-to-digital converter of claim 7, wherein the analog-to-digital converter further comprises:
   a summation device, wherein the summation device receives the four bit encoded word output, the first two bit unencoded word output and the second two bit unencoded word output; and
   wherein the summation device is operable to:
      shift the four bit encoded word output left two positions;
      shift the first two bit unencoded word output left two positions; and
      aggregate the shifted four bit encoded word output, the shifted first two bit unencoded word output and the second two bit unencoded word output.

9. The analog-to-digital converter of claim 4, wherein the four bit encoded data word represents five levels, and wherein the four bit encoded data word is encoded with the following codes representing each of the five levels:
   first level '0000';
   second level '0011';
   third level '0110';
   fourth level '1001'; and
   fifth level '11100'.

10. The analog-to-digital converter of claim 4, wherein the 2.3 bit analog-to-digital converter stage includes:
   four comparators; and
   an encoder.

11. The analog-to-digital converter of claim 1, wherein the preceding analog-to-digital converter stage includes:

a 2.3 bit analog-to-digital converter, wherein the 2.3 bit analog-to-digital converter is electrically coupled to an analog voltage input, wherein the 2.3 bit analog-to-digital converter is operable to provide a raw data word representative of the analog voltage input less a residue, wherein the 2.3 bit analog-to-digital converter is operable to provide the encoded word output, and wherein the encoded word output is representative of the analog voltage input less the residue;

a digital-to-analog converter, wherein the digital-to-analog converter receives the raw data word as an input, and wherein the digital-to-analog converter is operable to provide a first analog output representative of the analog voltage input less the residue;

a summation device, wherein the summation device is configured to subtract the first analog output from the analog voltage input to form a pre-amplified analog residue output; and an amplifier, wherein the amplifier is operable to receive and amplify the pre-amplified analog residue output to form the analog residue output.

12. A method for implementing an analog-to-digital converter, wherein the method comprises:

providing a preceding analog-to-digital converter stage, wherein the preceding analog-to-digital converter stage is a 2.3 bit analog-to-digital converter stage, and wherein the preceding analog-to-digital converter stage provides an encoded word output;

providing a subsequent analog-to-digital converter stage, wherein the subsequent analog-to-digital converter stage provides an unencoded word output;

providing a summation device;

electrically coupling a residue output of the preceding analog-to-digital converter stage to an input port of the subsequent analog-to-digital converter stage; and adding the encoded word output with the unencoded word output in the summation device.

13. The method of claim 12, wherein the preceding analog-to-digital converter stage is a first 2.3 bit analog-to-digital converter stage, wherein the encoded output is a first encoded output, wherein the residue output is a first residue output, and wherein the method further comprises:

providing a second 2.3 bit analog-to-digital converter stage, wherein the second 2.3 bit analog-to-digital converter stage provides a second encoded word output;

electrically coupling a second residue output of the second 2.3 bit analog-to-digital converter stage to an input of the first 2.3 bit analog-to-digital converter stage;

shifting the second encoded data word left two positions; and adding the first encoded word output, the second encoded word output and the unencoded word output in the summation device.

14. The method of claim 12, wherein the summation device is a first summation device, and wherein the preceding analog-to-digital converter stage includes:

a 2.3 bit analog-to-digital converter, wherein the 2.3 bit analog-to-digital converter is electrically coupled to an analog voltage input, wherein the 2.3 bit analog-to-digital converter is operable to provide a raw data word representative of the analog voltage input less a residue, wherein the 2.3 bit analog-to-digital converter is operable to provide the encoded word, and wherein the encoded word is representative of the analog voltage input less the residue;

a digital-to-analog converter, wherein the digital-to-analog converter receives the raw data word as an input, and wherein the digital-to-analog converter is operable to provide a first analog output representative of the analog voltage input less the residue;

a second summation device, wherein the second summation device is configured to subtract the first analog output from the analog voltage input to form an analog residue output; and an amplifier, wherein the amplifier is operable to receive and amplify the analog residue output.

15. The method of claim 12, wherein the preceding analog-to-digital converter stage is a first 2.3 bit analog-to-digital converter stage, and wherein the subsequent analog-to-digital converter stage is selected from a group consisting of: a three comparator analog-to-digital converter stage, and a six comparator analog-to-digital comparator stage.

16. A pipelined analog-to-digital converter, the pipelined analog-to-digital converter comprising:

a two bit, four comparator analog-to-digital converter stage, wherein the two bit, four comparator analog-to-digital converter stage provides an encoded word output representing five successive levels, and wherein the two bit, four comparator analog-to-digital converter stage provides an analog residue output; and a two bit analog-to-digital converter stage, wherein the two bit analog-to-digital converter receives the analog residue output and provides a two bit unencoded word representative of the analog residue output.

17. The pipelined analog-to-digital converter of claim 16, wherein the pipelined analog-to-digital converter further comprises:

a summation device, wherein the summation device is operable to aggregate the encoded word output with the two bit unencoded word.

18. The pipelined analog-to-digital converter of claim 17, wherein the two bit, four comparator analog-to-digital converter stage is a preceding two bit, four comparator analog-to-digital converter stage, wherein the analog residue output is a first analog residue output, wherein the encoded word output is a first encoded word output, and wherein the pipelined analog-to-digital converter further comprises:

a subsequent two bit, four comparator analog-to-digital converter stage, wherein the subsequent two bit, four comparator analog-to-digital converter stage provides a second encoded word output representing five successive levels, and wherein the second two bit, four comparator analog-to-digital converter stage provides a second analog residue output; and wherein the second analog residue input is provided to the preceding two bit, four comparator analog-to-digital converter stage, wherein the first encoded word output is representative of the second analog residue output less a residue, and wherein the first analog residue output is representative of the residue.

19. The pipelined analog-to-digital converter of claim 18, wherein the summation device is operable to:

receive the second encoded word;

shift the second encoded word left two positions; and aggregate the first encoded word, the second encoded word and the two bit unencoded word.

20. The pipelined analog-to-digital converter of claim 16, wherein the encoded word is a four bit word encoded with the following codes representing the respective levels:

first level '0000';
second level '0011';
third level '0110';
fourth level '1001'; and
fifth level '1100'.

* * * * *

UNITED STATES PATENT AND TRADEMARK OFFICE
CERTIFICATE OF CORRECTION

| | |
|---|---|
| PATENT NO. | : 7,209,068 B1 |
| APPLICATION NO. | : 11/347345 |
| DATED | : April 24, 2007 |
| INVENTOR(S) | : Mingding Chen, James A. Bailey and Siamak Mortezapour |

It is certified that error appears in the above-identified patent and that said Letters Patent is hereby corrected as shown below:

1. Column 4/line 8: The number "11100" should read --1100--
2. Column 10/line 55: The number "10a" should read --110a--
3. Column 10/line 60: The number "10a" should read --110a--
4. Column 14/line 24: The symbol "(D" should read --ϕ--
5. Column 16/line 61: The number "11100" should read --1100--

Signed and Sealed this

Tenth Day of July, 2007

JON W. DUDAS
*Director of the United States Patent and Trademark Office*